(12) United States Patent
Blumberg (10) Patent No.: US 8,344,750 B2
(45) Date of Patent: Jan. 1, 2013

(54) SURFACE-PLASMON DETECTOR BASED ON A FIELD-EFFECT TRANSISTOR

(75) Inventor: Girsh Blumberg, New Providence, NJ (US)

(73) Assignee: Alcatel Lucent, Paris (FR)

( * ) Notice: Subject to any disclaimer, the term of this patent is extended or adjusted under 35 U.S.C. 154(b) by 588 days.

(21) Appl. No.: 12/054,640

(22) Filed: Mar. 25, 2008

(65) Prior Publication Data

US 2009/0243589 A1 Oct. 1, 2009

(51) Int. Cl.
*G01R 31/02* (2006.01)
*G01R 31/26* (2006.01)

(52) U.S. Cl. .................................. 324/762.09

(58) Field of Classification Search .............. None
See application file for complete search history.

(56) References Cited

U.S. PATENT DOCUMENTS

| | | | | |
|---|---|---|---|---|
| 4,360,246 A * | 11/1982 | Figueroa et al. | ............... | 385/14 |
| 5,536,954 A * | 7/1996 | Rosen et al. | ............... | 257/187 |
| 5,668,512 A * | 9/1997 | Mohwinkel et al. | ......... | 333/247 |
| 5,821,815 A * | 10/1998 | Mohwinkel | ................ | 330/286 |
| 6,075,640 A | 6/2000 | Nelson | | |
| 6,801,691 B2 | 10/2004 | Berini | | |
| 7,027,689 B2 * | 4/2006 | Blumberg et al. | ............ | 385/39 |
| 7,039,277 B2 | 5/2006 | Blumberg et al. | ............ | 385/39 |
| 7,039,315 B2 | 5/2006 | Blumberg et al. | ............ | 398/49 |
| 7,126,151 B2 * | 10/2006 | Estes et al. | ..................... | 257/25 |
| 7,421,002 B2 * | 9/2008 | Furuyama | .................... | 372/64 |
| 7,447,396 B2 | 11/2008 | Hyde et al. | | |
| 7,671,996 B2 * | 3/2010 | Niwa et al. | .................. | 356/445 |
| 7,706,653 B2 | 4/2010 | Park et al. | | |
| 2003/0059147 A1 | 3/2003 | Berini | | |
| 2005/0158850 A1 * | 7/2005 | Kubo et al. | ............... | 435/287.2 |
| 2006/0040326 A1 * | 2/2006 | Ohtsuka | ...................... | 435/7.1 |
| 2006/0187460 A1 * | 8/2006 | Tsuzuki | ...................... | 356/445 |
| 2007/0103755 A1 * | 5/2007 | Furuyama | .................. | 359/211 |
| 2007/0286546 A1 * | 12/2007 | Masson et al. | ................ | 385/12 |
| 2008/0212975 A1 * | 9/2008 | Burenkov | ..................... | 438/27 |
| 2009/0052827 A1 * | 2/2009 | Durfee et al. | ................... | 385/2 |
| 2009/0065801 A1 * | 3/2009 | Conway et al. | ............... | 257/104 |
| 2009/0066962 A1 * | 3/2009 | Niwa et al. | ................. | 356/445 |

(Continued)

FOREIGN PATENT DOCUMENTS

JP 53004446 A * 1/1978

OTHER PUBLICATIONS

W. L. Barnes, et al., entitled "Surface Plasmon Subwavelength Optics," published in Nature, Aug. 14, 2003, v. 424, pp. 824-830.

(Continued)

*Primary Examiner* — Jermele M Hollington
(74) *Attorney, Agent, or Firm* — Mendelsohn, Drucker & Associates, P.C.; Yuri Gruzdkov; Steve Mendelsohn (57) ABSTRACT

According to one embodiment, a surface-plasmon (SP) beam generated by an SP source and directed via an SP waveguide is applied to a gate node of a field-effect transistor (FET). The FET also has a source node and a drain node. In a representative configuration, the gate, source, and drain nodes are electrically biased to pass an electrical current between the source and drain nodes in a manner that makes the electrical current responsive to the intensity of the SP beam.

20 Claims, 5 Drawing Sheets

U.S. PATENT DOCUMENTS

2009/0195783 A1* 8/2009 Tazuke et al. .................. 356/445
2010/0202728 A1* 8/2010 Blumberg et al. ............... 385/14
2011/0128614 A1* 6/2011 Blumberg et al. ............. 359/328

OTHER PUBLICATIONS

D. Egorov, et al., entitled "Two-Dimensional Control of Surface Plasmons and Directional Beaming from Arrays of Subwavelength Apertures," published in Physical Review B 70, 033404 (2004), (4 pages).

O. Roslyak, et al., entitled "Theory of Enhanced Second-Harmonic Generation by the Quadrupole-Dipole Hybrid Exciton," arXiv:0704.1923v2 [cond-mat.mtrl-sci] May 5, 2007, (9 pages).

E. Ozbay, entitled "Plasmonics: Merging Photonics and Electronics at Nanoscale Dimensions," www.sciencemag.org, SCIENCE vol. 311, Jan. 13, 2006, pp. 189-193.

Schreieck et al., "All-Optical Switching at Multi-100-gb/s Data rates with Mach-Zehnder Interferometer Switches," IEEE Journal of Quantum Electronics, vol. 38, No. 8, pp. 1053-1061, Aug. 2002.

Leung, "p-Polarized Nonlinear Surface Polaritons in Materials with Intensity-Dependent Dielectric Functions," Physical Review B, vol. 32, No. 8, pp. 5093-5101, 1985.

Gonzalez et al., "Design, Near-Field Characterization, and Modeling of 45° Surface-Plasmon Bragg Mirrors," Physical Review B, vol. 73, pp. 1555416-1 through 155416-13, 2006.

Lee et al., "Pump-Probe Optical Switching in Prism-Coupled Au:SiO2 Nanocomposite Waveguide Film," Applied Physical Letters, vol. 91, pp. 141905-1 through 141905-3, 2007.

Han et al., "Ultra-Compact Directional Couplers and Mach-Zehnder Interferometers Employing Plasmon Polaritons," Optics Communications, vol. 259, pp. 690-695, 2006.

* cited by examiner

AA

SURFACE-PLASMON DETECTOR BASED ON A FIELD-EFFECT TRANSISTOR

BACKGROUND OF THE INVENTION

1. Field of the Invention

The present invention relates to electronic and/or plasmonic circuit elements and, more specifically, to surface-plasmon signal detectors.

2. Description of the Related Art

This section introduces aspects that may help facilitate a better understanding of the invention(s). Accordingly, the statements of this section are to be read in this light and are not to be understood as admissions about what is in the prior art and/or what is not in the prior art.

Surface plasmons (SPs), also often referred to as surface-plasmon polaritons, are surface-bound waves that can propagate, e.g., along a metal-dielectric interface or along a metal-vacuum interface. An SP can be qualitatively viewed as a combination of an electromagnetic wave and an associated charge-density wave. The electromagnetic wave propagates along the interface due to its interaction with free surface charges of the metal. The interaction also causes the surface charges to oscillate in resonance with the electromagnetic wave. The combined physical entity created via this resonant interaction, i.e., an entity including a charge-density wave and a corresponding electromagnetic wave, is an SP. A detailed description of certain physical properties of SPs can be found, e.g., in an article by W. L. Barnes, et al., entitled "Surface Plasmon Subwavelength Optics," published in Nature, 14 Aug. 2003, v. 424, pp. 824-830, the teachings of which are incorporated herein by reference in its entirety.

SP signals find use in optical communication systems, e.g., as described in U.S. Pat. Nos. 7,027,689, 7,039,277, and 7,039,315, each of which is incorporated herein by reference in its entirety. To carry data, SP signals can be modulated at relatively high modulation speeds, e.g., on the order of 100 GHz. However, SP-signal detectors capable of appropriately responding to the full range of available modulation speeds are not yet sufficiently developed.

SUMMARY OF THE INVENTION

According to one embodiment, a surface-plasmon (SP) beam generated by an SP source and directed via an SP waveguide is applied to a gate node of a field-effect transistor (FET). The FET also has a source node and a drain node. In a representative configuration, the gate, source, and drain nodes are electrically biased to pass an electrical current between the source and drain nodes in a manner that makes the electrical current responsive to the intensity of the SP beam. Advantageously, the FET can serve as a relatively small and efficient SP-signal detector capable of responding to SP-beam modulation speeds as high as about 100 GHz, or even higher.

According to one embodiment, the invention provides a device having a FET comprising a control node, a first channel node, and a second channel node. The device also has a waveguide adapted to apply a beam of surface plasmons to the control node, the control node being such that an electrical current propagating between the first and second channel nodes is responsive to an applied intensity of the beam.

According to another embodiment, a method of operating a FET having a control node, a first channel node, and a second channel node has the steps of: (A) applying a voltage between the first and second channel nodes; and (B) applying a beam of surface plasmons to the control node such that an electrical current propagating between the first and second channel nodes responds to an applied intensity of the beam.

According to yet another embodiment, a method of detecting surface plasmons has the steps of: (A) receiving a beam of surface plasmons at a control node of a FET, the FET having the control node, a first channel node, and a second channel node; (B) measuring an electrical current propagating between the first and second channel nodes; and (C) estimating an intensity of the beam based on the measured electrical current.

BRIEF DESCRIPTION OF THE DRAWINGS

Other aspects, features, and benefits of the present invention will become more fully apparent from the following detailed description, the appended claims, and the accompanying drawings in which:

DETAILED DESCRIPTION

Figure 1:
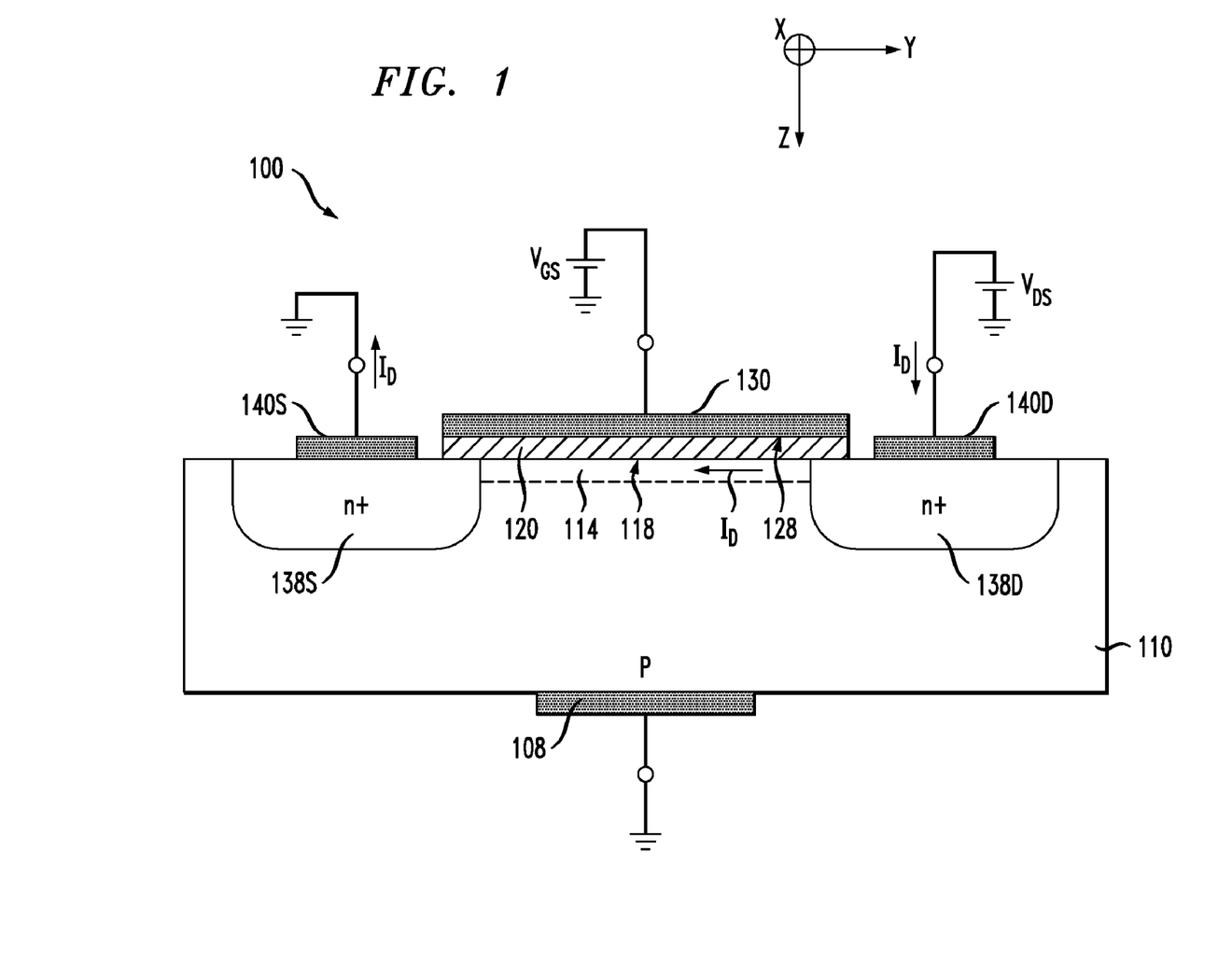
FIG. 1 shows a cross-sectional side view of a field-effect transistor (FET) according to one embodiment of the invention.

FIG. 1 shows a cross-sectional side view of a field-effect transistor (FET) 100 according to one embodiment of the invention. FIG. 1 also shows certain representative electrical connections, voltages, and currents that help to explain the operation of FET 100. As further detailed below, FET 100 can be configured using a prior-art method of operation and/or a method of operation according to one embodiment of the invention. These methods are described in reference to FIGS. 2A-C and FIG. 4, respectively.

In the embodiment of FIG. 1, FET 100 is an n-channel device. In an alternative embodiment, FET 100 can be a p-channel device. As known in the art, n- and p-channel FETs principally conduct through electrons and holes, respectively. While the description below primarily focuses on an n-channel FET, one of ordinary skill in the art will be able to use this description to derive a description applicable to a p-channel FET, e.g., by reversing the polarity of the voltages and currents and by swapping the "n" and "p" designations.

FET 100 has a built-in capacitor formed by a substrate 110 and a gate (or control) node 130. Substrate 110 can be electrically biased using a substrate-body node 108. Gate node 130 is formed over an insulating (e.g., dielectric) layer 120, which is deposited over substrate 110 as shown in FIG. 1. FET 100 further has two additional nodes 140S and 140D, each connected to a corresponding one of relatively highly doped regions 138S,D formed within substrate 110. Substrate 110 is made of a p-type semiconductor and each of doped regions 138S,D is made of an n-type semiconductor. In one embodiment, substrate 110 and doped regions 138S,D are made of appropriately doped silicon; insulating layer 120 is made of silicon oxide or silicon nitride; and each of nodes 108, 130, and 140 is made of a respective metal, such as aluminum, copper, silver, gold, or an alloy containing one or more of these metals.

In one embodiment, nodes 140S,D can be structurally identical to each other. Similarly, doped regions 138S,D can also be structurally identical to each other. For this embodiment, the designations "S" (source) and "D" (drain) depend solely on the voltages applied to the nodes during operation. More generically, nodes 140S,D can be referred to as "channel" nodes of FET 100.

In a representative configuration of FET 100, substrate 110 and doped region 138S are grounded by connecting nodes 108 and 140S to a ground (or reference) terminal of a power supply as shown in FIG. 1. A positive voltage $V_{GS}$ applied to gate node 130 modifies the distribution of charges in substrate 110 by forcing the positively charged holes away from an interface 118 between insulating layer 120 and the substrate, thereby creating a depletion layer (not explicitly shown in FIG. 1) that extends between doped regions 138S,D. If voltage $V_{GS}$ is sufficiently high, then an inversion layer 114 is formed within the depletion layer. Inversion layer 114 has a relatively high concentration of negative charge carriers and, as such, is referred to as an n-channel. If a positive voltage $V_{DS}$ is applied to node 140D, then a drain current $I_D$ will flow between that node and node 140S as shown in FIG. 1.

Figure 2A:
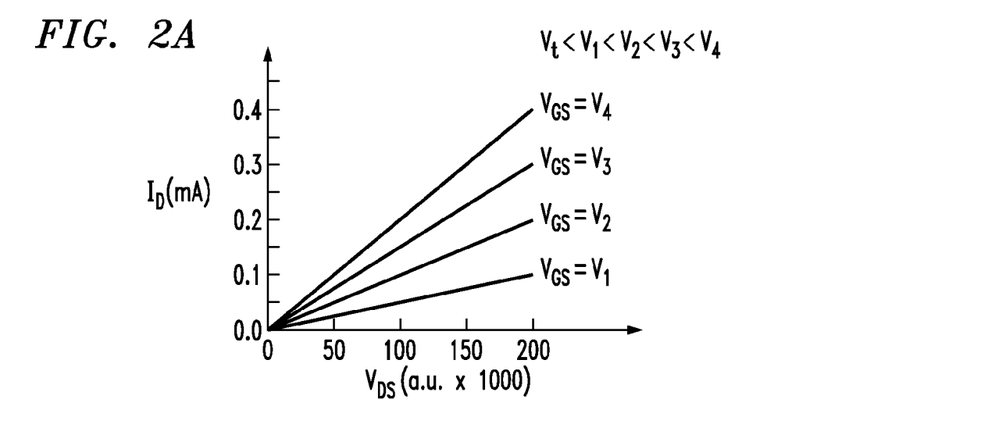
FIGS. 2A-C graphically show a prior-art method of operation for the FET shown in FIG. 1.
Figure 2B:
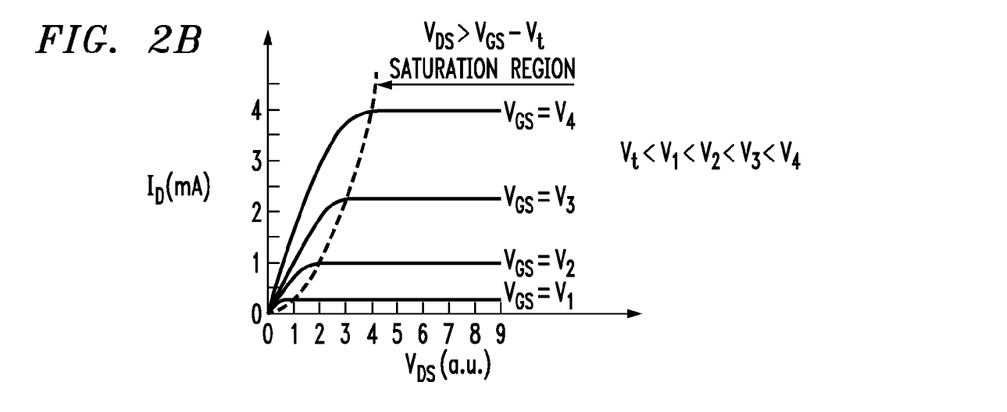
Figure 2C:
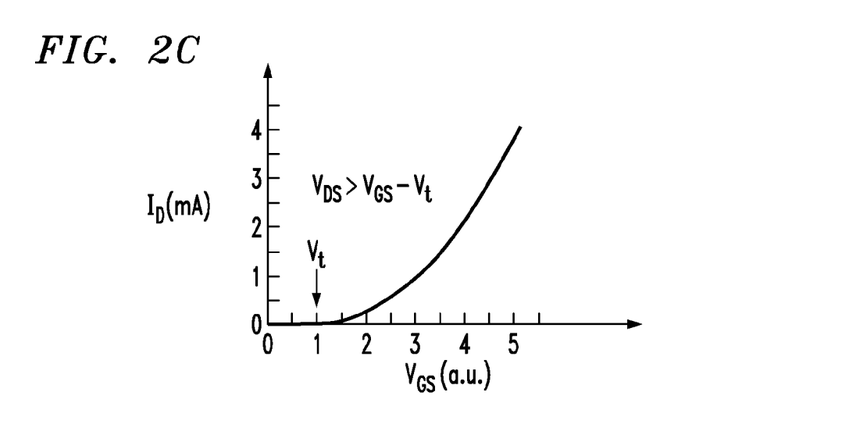

FIGS. 2A-C graphically show a prior-art method of operation for FET 100. FET 100 is generally characterized by a positive threshold voltage $V_t$. If voltage $V_{GS}$ is smaller than threshold voltage $V_t$, then channel 114 is pinched off and substantially no current flows between nodes 140S,D ($I_D$=0) regardless of the value of $V_{DS}$. This operating region is referred to as the cut-off region. If voltage $V_{GS}$ is greater than threshold voltage $V_t$, then $I_D \neq 0$ and the drain current depends on the values of $V_{GS}$ and $V_{DS}$. A configuration of FET 100 corresponding to each specific pair of $V_{GS}$ and $V_{DS}$ generally falls into one of the following three additional operating regions: the triode or ohmic region, the transition region, and the saturation region.

FIG. 2A graphically shows drain current $I_D$ as a function of voltages $V_{GS}$ and $V_{DS}$ in the ohmic operating region. For a fixed value of $V_{GS}$, drain current $I_D$ increases substantially linearly with an increase in $V_{DS}$. As a result, FET 100 substantially functions as a voltage-controlled resistor, hence the term "ohmic operating region."

FIG. 2B graphically shows drain current $I_D$ as a function of voltages $V_{GS}$ and $V_{DS}$ over a voltage range that covers the ohmic, transition, and saturation operating regions. In the saturation operating region, drain current $I_D$ does not depend on voltage $V_{DS}$. For a fixed value of $V_{DS}$, drain current $I_D$ varies with voltage $V_{GS}$ as shown in FIG. 2C. FET 100 is generally in the saturation operating region if $V_{DS} > V_{GS} - V_t$ (see FIG. 2B). If voltage $V_{DS}$ is decreased to a value just below $V_{GS} - V_t$, then FET 100 enters the transition operating region, where, at a fixed value of $V_{GS}$, the relationship between drain current $I_D$ and voltage $V_{DS}$ is described by a nonlinear function. If voltage $V_{DS}$ is further decreased to a relatively small value, then FET 100 enters the above-described ohmic operating region (see also FIG. 2A).

Referring back to FIG. 1, in one configuration of FET 100, an interface 128 between gate node 130 and insulating layer 120 is used as a conduit for a beam of surface plasmons (SP beam). The SP beam can be generated by an SP source (not explicitly shown in FIG. 1). Suitable methods and devices for generating SP beams are disclosed, e.g., in (1) D. Egorov, et al., "Two-Dimensional Control of Surface Plasmons and Directional Beaming from Arrays of Subwavelength Apertures," Phys. Rev. B, 2004, v. 70, pub. 033404, which is incorporated herein by reference in its entirety, and (2) the above-cited U.S. Pat. Nos. 7,027,689, 7,039,277, and 7,039,315. The SP beam is guided from the SP source toward FET 100 so that its wave vector (propagation direction) within the FET is generally parallel to the X axis. For relatively thin (i.e., having a relatively small Z dimension) insulating layer 120, the evanescent electric field of the SP beam penetrates through the insulating layer into substrate 110 between doped regions 138S,D.

Figure 3A:
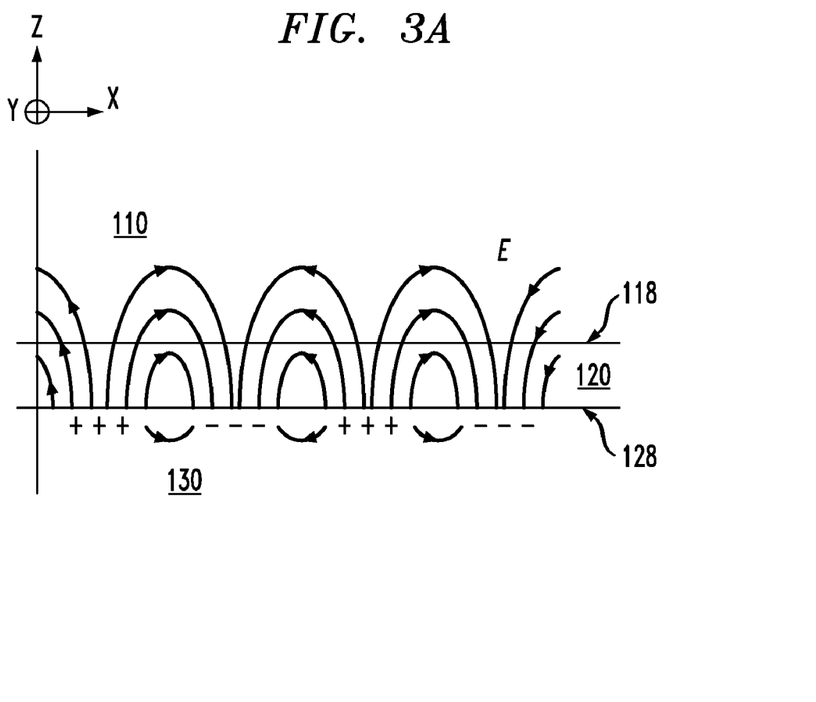
FIGS. 3A-B graphically illustrate penetration of the evanescent electric field of surface plasmons into the substrate of the FET shown in FIG. 1.
Figure 3B:
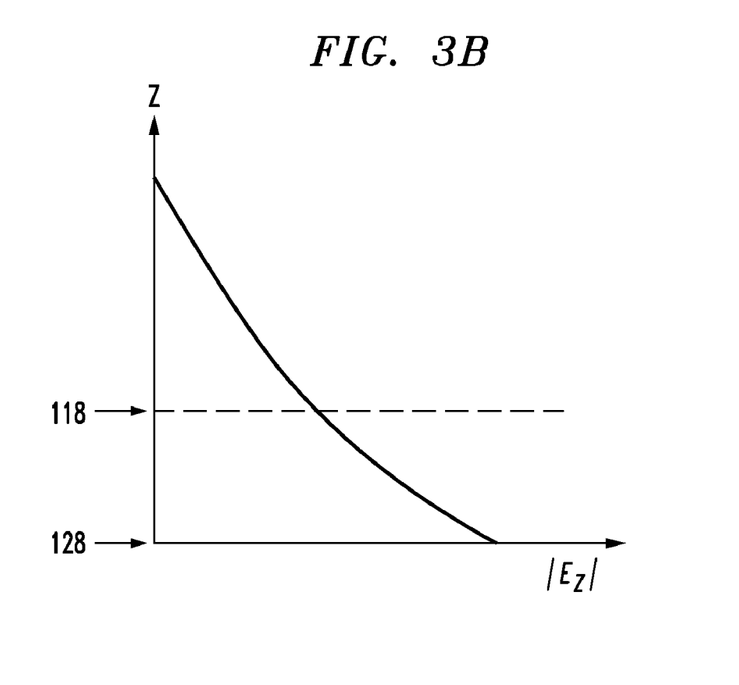

FIGS. 3A-B graphically illustrate penetration of the evanescent electric field of an SP beam into substrate 110. More specifically, FIG. 3A shows a cross-sectional electrical-charge/electric-field map of the SP beam in the gate area of FET 100 at a selected time. A cross-sectional map corresponding to a different time can be obtained, e.g., by appropriately shifting the electrical-charge/electric-field pattern shown in FIG. 3A along the X axis. FIG. 3B graphically shows the amplitude of the Z component ($E_z$) of the electric field of the SP beam as a function of the distance from interface 128.

Interface 128 is generally parallel to the XY plane of FET 100, and the cross-section shown in FIG. 3A is parallel to the XZ plane (see also FIG. 1). At interface 128, the electric field (E) is orthogonal to the interface boundary and is parallel to the Z axis. The Z component of the electric field is at a maximum at interface 128 and decreases exponentially as the distance from the interface boundary increases (see FIG. 3B). The characteristic (e-times) field-attenuation length is on the order of one half of the wavelength of the corresponding electromagnetic wave in the corresponding material (e.g., in the material of insulating layer 120 or in the material of substrate 110). If the thickness of insulating layer 120 is smaller than one half of the wavelength in the material of that layer, then a substantial amount of the evanescent electric field penetrates into substrate 110 as indicated in FIGS. 3A-B.

Figure 4:
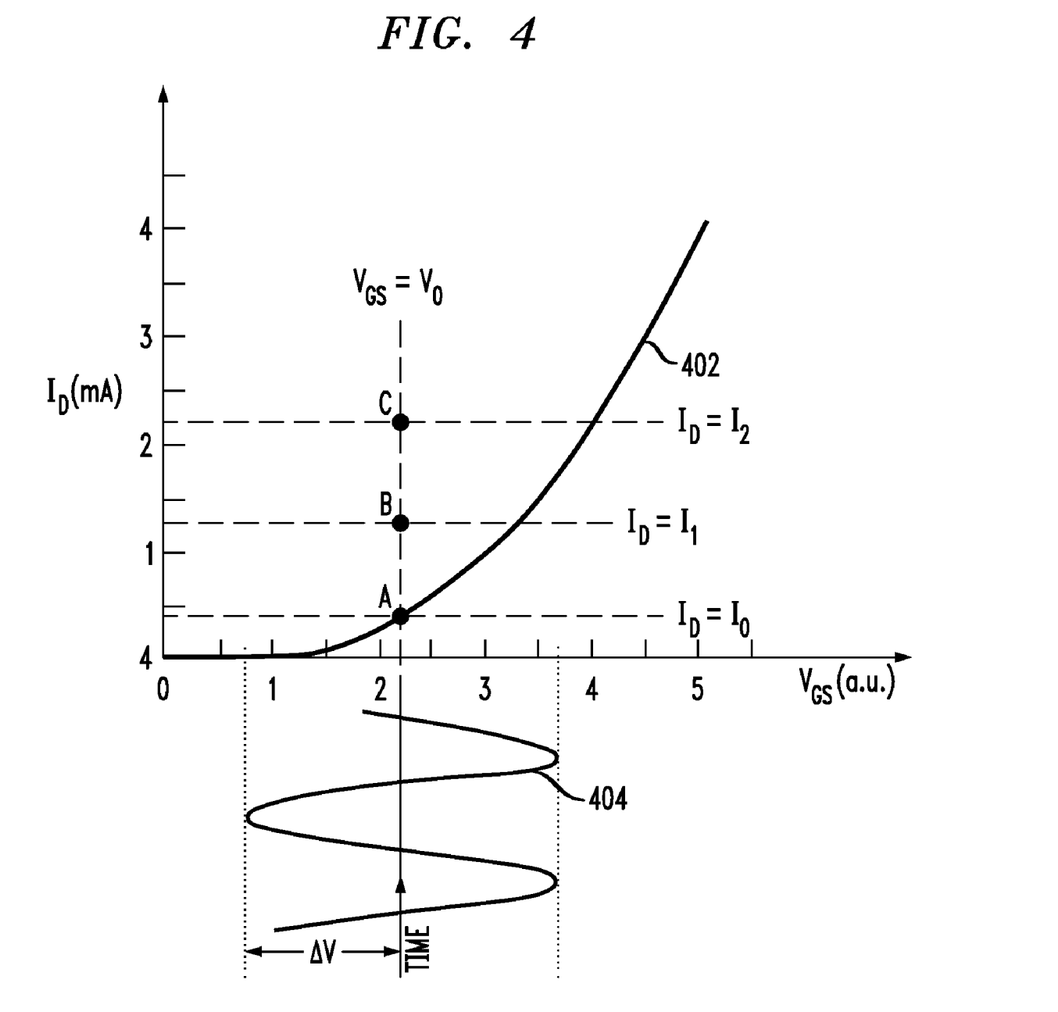
FIG. 4 graphically shows the effect of a surface-plasmon beam propagating along a gate/dielectric interface in the FET of FIG. 1 on the drain current.

FIG. 4 graphically shows the effect of an SP beam propagating along interface 128 on drain current $I_D$. A curve 402 in FIG. 4 is analogous to the curve shown in FIG. 2C and depicts drain current $I_D$ as a function of voltage $V_{GS}$ at a selected fixed value of $V_{DS}$. In the absence of an SP beam and with $V_{GS} = V_0$, the operating point of FET 100 is point A (having coordinates ($V_0$, $I_0$)) on curve 402.

As explained above in reference to FIGS. 3A-B, the evanescent electric field of an SP beam adds an oscillating electric-field component to the electric field induced in substrate 110 by electrically biased gate node 130. As a result, the total electric field in substrate 110 between doped regions 138S,D becomes modulated at the carrier frequency of the SP beam. FIG. 4 models the effect of that electric-field modulation on drain current $I_D$ based on an observation that an oscillating electric field similar to that produced by the SP beam can also be produced by adding to voltage $V_{GS}$ an ac component that oscillates at the carrier frequency of the SP beam.

A waveform 404 shown in FIG. 4 is a sine wave that oscillates at the carrier frequency of the SP beam. Waveform 404 has amplitude $\Delta V$ and is superimposed onto dc voltage $V_{GS} = V_0$. The value of $\Delta V$ is chosen so that the corresponding ac component of the electric field in substrate 110 has about the same amplitude as the amplitude of the Z component of the evanescent electric field of the SP beam. Note that $\Delta V$ is generally larger than a typical operating value of voltage $V_{GS}$ because a typical SP beam induces a relatively large evanescent electric field due to the effects of surface-induced electric-field enhancement at interface 128. In general, the response of FET 100 to waveform 404 depends on the waveform's carrier frequency and the properties of semiconductor substrate 110. Qualitatively, two spectral regions can be distinguished. A first spectral region corresponds to relatively low carrier frequencies, at which charge carriers (e.g., electrons and/or holes) in substrate 110 are able to travel relatively large distances under the influence of the oscillating electric field of waveform 404, thereby affecting the effective thickness of inversion layer 114 compared to that that in the absence of the waveform. A second spectral region corresponds to relatively high carrier frequencies, at which the oscillation amplitude of the charge carriers in substrate 110 in response to waveform 404 is insufficient to significantly affect the effective thickness of inversion layer 114. Depending on the properties of substrate 110, an approximate division line between these two spectral regions can lie anywhere between about 100 GHz and about 100 THz. Note that a carrier frequency of about 200 THz corresponds to a free-space optical carrier wavelength of about 1550 nm.

In the first spectral region, the modulation of voltage $V_{GS}=V_0$ by waveform 404 generally causes a corresponding modulation of drain current $I_D$. Point B (having coordinates $(V_0, I_1)$) represents the time-averaged operating point of FET 100 in the presence of waveform 404. Point B is located above point A for at least two reasons. First, curve 402, which serves as a transfer function between voltage $V_{GS}$ and drain current $I_D$, is nonlinear and amplifies the contribution into the drain current of operating points with $V_{GS}>V_0$ compared to that of operating points with $V_{GS}<V_0$. Second, curve 402 has a rectifying property that does not permit the polarity of drain current $I_D$ to be reversed.

Using the above-mentioned observation that the effect of waveform 404 on the operating point of FET 100 is similar to that of an SP beam received at interface 128, one can qualitatively understand the dependence of drain current $I_D$ on the intensity of the SP beam in the first spectral region. At frequencies belonging to the first spectral region, FET 100 responds to the oscillating evanescent electric field of the SP beam by substantially averaging its effect on the drain current. At voltage $V_{GS}=V_0$ and with the SP beam being absent, the operating point of FET 100 is point A on curve 402. If, without changing voltage $V_{GS}$, FET 100 receives an SP beam having intensity $P_1$, then, for the reasons explained above, the FET's operating point shifts up, e.g., from point A to point B. If the intensity of the SP beam is increased from $P_1$ to $P_2>P_1$, then the operating point of FET 100 shifts further up, e.g., to point C (having coordinates $(V_0, I_2)$). If the intensity of the SP beam is modulated at a relatively low (compared to the carrier frequency) modulation speed to vary between zero and $P_2$, then FET 100 responds by producing a correspondingly modulated drain current, which will vary between $I_D=I_0$ and $I_D=I_2$. As a result, FET 100 can serve as a relatively small and efficient SP-signal detector.

To be able to respond to an SP beam in the second spectral region, the semiconductor material of substrate 110 is selected so that the SP beam is capable of causing a charge-carrier transition (excitation) across the band gap between the valence and conduction bands of that material. This charge-carrier transition is similar to a photo transition produced by a conventional optical beam and requires that the energy of an SP in the beam be greater than the band gap. If nodes 140S,D are appropriately biased, then the charge carriers ("photo-") generated by the SP beam in substrate 110 between doped regions 138S,D will contribute to drain current $I_D$.

In general, the dependence of the drain current on the intensity of the SP beam in this case is qualitatively similar to that described above in reference to the first spectral region. More specifically, at voltage $V_{GS}=V_0$ and with the SP beam being absent, the operating point of FET 100 is point A on curve 402, with drain current $I_D=I_0$. If, without changing voltage $V_{GS}$, FET 100 receives an SP beam having intensity $P_1$, then the charge carriers ("photo-") generated by the SP beam contribute to the drain current and the FET's operating point shifts up, e.g., from point A to point B. If the intensity of the SP beam is increased from $P_1$ to $P_2>P_1$, then the correspondingly increased concentration of the ("photo-") generated charge carriers causes the drain current to further increase, thereby shifting the operating point of FET 100, e.g., to point C. If the intensity of the SP beam is modulated at a relatively low (compared to the carrier frequency) modulation speed to vary between zero and $P_2$, then FET 100 responds by producing a correspondingly modulated drain current. In a representative implementation, FET 100 is advantageously capable of responding to SP-beam modulation speeds as high as about 100 GHz, or even higher.

Figure 5A:
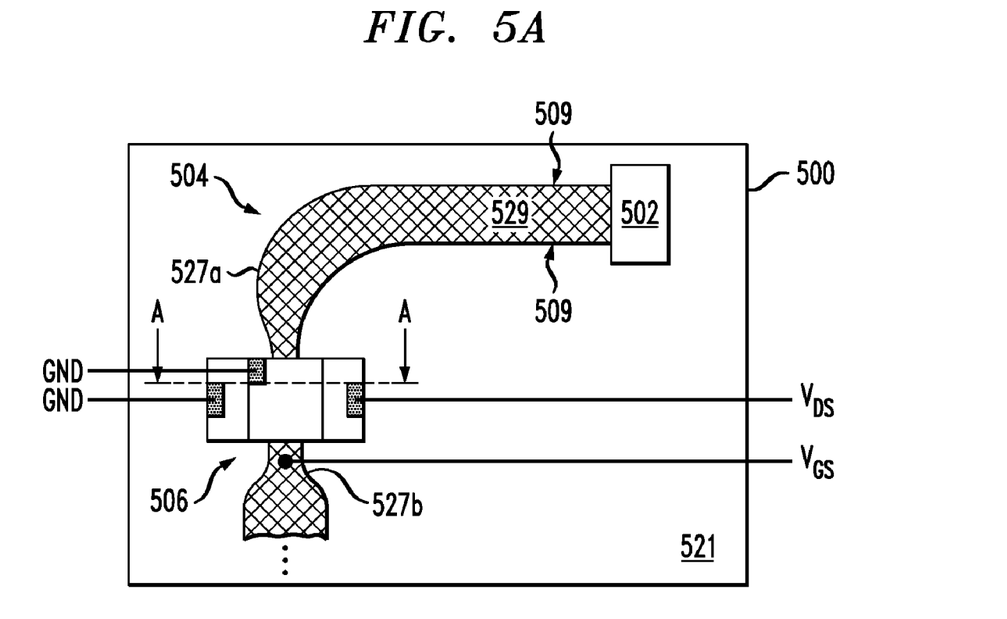
FIGS. 5A-B show top and cross-sectional side view of a circuit having a FET according to one embodiment of the invention.
Figure 5B:
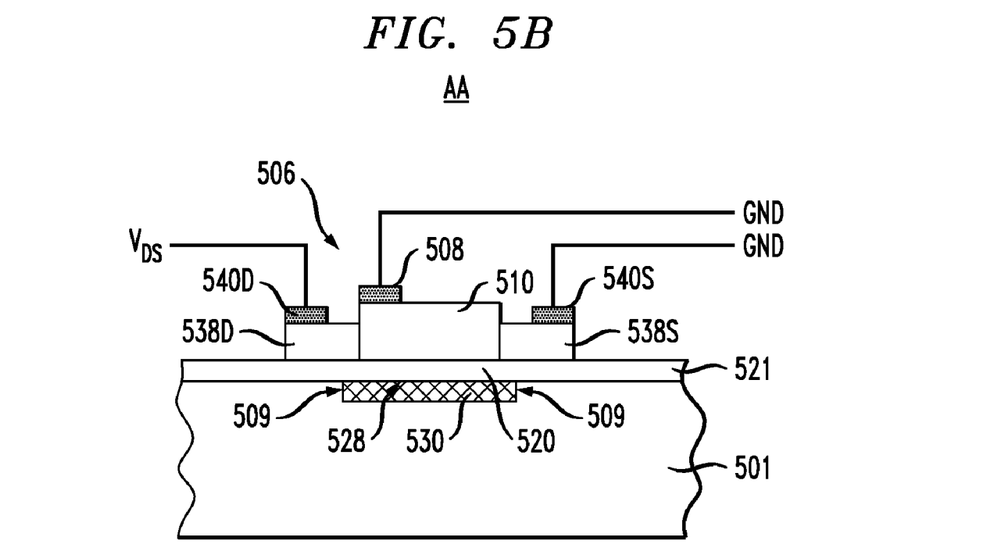

FIGS. 5A-B show top and cross-sectional side views of a circuit 500 having a FET 506 according to one embodiment of the invention. The cross-sectional side view shown in FIG. 5B has a different scale from the scale of the top view shown in FIG. 5A. More specifically, FIG. 5B shows an enlarged view of a cross-section of circuit 500 along the plane labeled AA in FIG. 5A.

Circuit 500 has an SP source 502 configured to generate an SP beam and direct it via an SP waveguide 504 to FET 506. SP source 502 can be, e.g., an SP source disclosed in one of the above-cited U.S. Pat. Nos. 7,027,689, 7,039,277, and 7,039,315. SP waveguide 504 has a metal stripe 529 adjacent to a dielectric layer 521. An interface 528 between stripe 529 and layer 521 serves as a conduit for the SP beam generated by SP source 502. Edges 509 of stripe 529 laterally confine the SP beam and enable waveguide 504 to guide the SP beam toward FET 506. In various embodiments, stripe 529 can have one or more curved sections that change the propagation direction of the SP beam. Stripe 529 may optionally have two tapered portions 527a-b, within which the width (i.e., the in-plane transverse dimension) of the stripe is not constant. More specifically, in each of portions 527a-b, the width of stripe 529 decreases as the stripe approaches (gets closer to) FET 506. Tapered portions 527a-b can help to increase the SP-beam intensity within FET 506 compared to that outside the FET by focusing (decreasing the cross-sectional width of) the SP beam. Stripe 529 further has a portion 530 that serves as a gate node for FET 506. A portion 520 of layer 521 that is adjacent to gate node 530 serves as a gate dielectric layer for gate node 530. The SP beam is not necessarily terminated at FET 506 and may continue on along waveguide 504 on the other side of the FET. In one embodiment, circuit 500 may have additional circuitry (not explicitly shown in FIG. 5) located between SP source 502 and FET 506 and/or further downstream from the FET.

FET 506 is configured to operate as an SP-beam detector and is generally analogous to FET 100 (FIG. 1), with analogous elements of the two FETs being designated with labels having the same last two digits. Doped-semiconductor blocks 538S,D and channel-semiconductor block 510 are formed over dielectric layer 521. Layer 521 and semiconductor blocks 510 and 538S,D are supported on a relatively thick structural support layer 501. Metal stripe 529 is recessed into a groove in support layer 501. In a representative configuration, source node 540S and channel-semiconductor node 508 are connected to a ground (GND) terminal of a power supply (not explicitly shown in FIG. 5). Gate node 530 and drain node 540D are configured to receive voltages $V_{GS}$ and $V_{DS}$, respectively.

While this invention has been described with reference to illustrative embodiments, this description is not intended to be construed in a limiting sense. For example, a FET of the invention may be implemented using various appropriate geometries of its structural elements and have more than one source, drain, and/or gate. FET of the invention may be configured to operate using various combinations of voltages, including $V_{GS}=0$. Various modifications of the described embodiments, as well as other embodiments of the invention, which are apparent to persons skilled in the art to which the invention pertains are deemed to lie within the principle and scope of the invention as expressed in the following claims.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected" refer to any manner known in the art in which energy of the relevant type, e.g., optical energy or plasmonic energy, is allowed to be transferred between two or more elements, and the interposition of one or more additional elements is contemplated, although not required. Conversely, the terms "directly coupled," "directly connected," etc., imply the absence of such additional elements.

Although the transistors disclosed herein have been shown as single devices, it should be understood by those with ordinary skill in the art that transistors may have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either a source node or a drain node of a FET. Similarly, the term "control node" refers generically to a gate node of the FET.

What is claimed is:

1. A device, comprising:
a field-effect transistor (FET) comprising a control node, a first channel node, and a second channel node; and
a waveguide adapted to apply a beam of surface plasmons to the control node, the control node being such that an electrical current propagating between said first and second channel nodes is responsive to an applied intensity of said beam.

2. The invention of claim 1, wherein said electrical current is responsive to an electric potential applied to the control node.

3. The invention of claim 1, further comprising a source of surface plasmons, wherein said beam is received via the waveguide from said source.

4. The invention of claim 3, wherein the waveguide is adapted to change one or more of a propagation direction, a cross-section, and an intensity distribution for said beam while guiding the beam toward the control node.

5. The invention of claim 1, wherein the waveguide comprises:
an electrically conducting layer; and
a dielectric layer adjacent to the electrically conducting layer, wherein an interface between the electrically conducting layer and the dielectric layer defines a conduit for propagation of the beam.

6. The invention of claim 5, wherein the electrically conducting layer is laterally patterned to define lateral dimensions of the waveguide.

7. The invention of claim 5, wherein the electrically conducting layer comprises a tapered portion adapted to change a cross-section of said beam.

8. The invention of claim 5, wherein the waveguide comprises the control node and a structure that is external to the FET.

9. The invention of claim 1, wherein the FET comprises:
a substrate comprising semiconductor of a first type;
a dielectric layer adjacent to a surface of the substrate, wherein the control node is locally physically connected to the dielectric layer; and
first and second regions within the substrate, each of said regions comprising semiconductor of a second type, wherein:
the first channel node is in direct electrical contact with the first region;
the second channel node is in direct electrical contact with the second region; and
the substrate is adapted to conduct said electrical current between the first and second regions.

10. The invention of claim 9, wherein:
the semiconductor of the first type is a p-doped silicon;
the semiconductor of the second type is an n-doped silicon;
the dielectric layer comprises a silicon oxide or a silicon nitride; and
each of the control, first channel, and second channel nodes comprises metal.

11. The invention of claim 1, wherein the FET comprises:
a structural support layer, wherein the control node comprises a metal stripe locally physically connected to the structural support layer;
a dielectric layer adjacent to the structural support layer and the metal stripe;
a first semiconductor block comprising semiconductor of a first type; and
second and third semiconductor blocks, each of said second and third blocks comprising semiconductor of a second type, wherein:
the first, second, and third semiconductor blocks are locally physically connected to the dielectric layer;
the first channel node is in direct electrical contact with the second semiconductor block;
the second channel node is in direct electrical contact with the third semiconductor block; and
the first semiconductor block is adapted to conduct said electrical current between the second and third semiconductor blocks.

12. The invention of claim 1, wherein:
the FET comprises a semiconductor substrate characterized by a band gap; and
the substrate is adapted to generate mobile charge carriers in response to the beam via charge-carrier excitations across the band gap.

13. A method of operating a field-effect transistor (FET) comprising a control node, a first channel node, and a second channel node, the method comprising:
applying a voltage between the first and second channel nodes; and
applying a beam of surface plasmons to the control node such that an electrical current propagating between the first and second channel nodes responds to an applied intensity of said beam.

14. The invention of claim 13, further comprising receiving said beam at the control node via a planar waveguide.

15. The invention of claim 14, further comprising changing one or more of a propagation direction, a cross-section, and an intensity distribution for said beam while guiding said beam along said waveguide toward the control node.

16. The invention of claim 13, further comprising changing the intensity of said beam to change said electrical current.

17. The invention of claim 13, wherein:
the FET comprises:
  a substrate comprising a semiconductor of a first type;
  a dielectric layer adjacent to the substrate, wherein the control node is located in or next to the dielectric layer; and
  first and second regions within the substrate, each comprising a semiconductor of a second type, wherein:
    the first channel node is in direct electrical contact with the first region;
    the second channel node is in direct electrical contact with the second region; and
    the substrate is adapted to conduct the electrical current between the first and second regions; and
the method further comprises:
  applying a reference electric potential to the first channel node;
  electrically biasing the control node with respect to the reference potential to create an inversion channel in the substrate between the first and second regions; and
  electrically biasing the second channel node with respect to the reference potential to drive said electrical current through the inversion channel.

18. The invention of claim 13, wherein:
the FET comprises:
  a structural support layer, wherein the control node comprises a metal stripe locally physically connected to the structural support layer;
  a dielectric layer adjacent to the structural support layer and the metal stripe;
  a first semiconductor block comprising a semiconductor of a first type; and
  second and third semiconductor blocks, each comprising a semiconductor of a second type, wherein:
    the first, second, and third semiconductor blocks are locally physically connected to the dielectric layer;
    the first channel node is in direct electrical contact with the second semiconductor block;
    the second channel node is in direct electrical contact with the third semiconductor block; and
    the first semiconductor block is adapted to conduct the electrical current between the second and third semiconductor blocks; and
the method further comprises:
  applying a reference electric potential to the first channel node;
  electrically biasing the control node with respect to the reference potential to create an inversion channel in the first semiconductor block between the second and third semiconductor blocks; and
  electrically biasing the second channel node with respect to the reference potential to drive said electrical current through the inversion channel.

19. The invention of claim 13, wherein:
the FET comprises a semiconductor substrate characterized by a band gap; and
the application of said beam causes charge-carrier excitations across the band gap in the semiconductor substrate.

20. A method of detecting surface plasmons, comprising:
receiving a beam of surface plasmons at a control node of a field-effect transistor (FET), said FET comprising the control node, a first channel node, and a second channel node;
measuring an electrical current propagating between the first and second channel nodes; and
estimating an intensity of said beam based on the measured electrical current.

* * * * *